US007816428B2

(12) United States Patent
Sasaki et al.

(10) Patent No.: US 7,816,428 B2
(45) Date of Patent: Oct. 19, 2010

(54) INORGANIC HOLLOW PARTICLE, PROCESS FOR PRODUCING THE SAME, AND COMPOSITION CONTAINING THE SAME

(75) Inventors: Shuji Sasaki, Omuta (JP); Yasuhisa Nishi, Omuta (JP); Shinji Yamano, Omuta (JP); Mitsuyoshi Iwasa, Omuta (JP)

(73) Assignee: Denki Kagaku Kogyo Kabushiki Kaisha, Tokyo (JP)

( * ) Notice: Subject to any disclaimer, the term of this patent is extended or adjusted under 35 U.S.C. 154(b) by 68 days.

(21) Appl. No.: 12/278,156

(22) PCT Filed: Apr. 24, 2007

(86) PCT No.: PCT/JP2007/058799

§ 371 (c)(1),
(2), (4) Date: Aug. 4, 2008

(87) PCT Pub. No.: WO2007/125891

PCT Pub. Date: Nov. 8, 2007

(65) Prior Publication Data

US 2009/0030134 A1   Jan. 29, 2009

(30) Foreign Application Priority Data

Apr. 24, 2006  (JP) ............................. 2006-119202

(51) Int. Cl.
*C08J 9/32* (2006.01)
(52) U.S. Cl. ...................................... 523/218; 523/219
(58) Field of Classification Search .................. 523/218, 523/219
See application file for complete search history.

(56) References Cited

FOREIGN PATENT DOCUMENTS

| JP | 4 37017 | 6/1992 |
|---|---|---|
| JP | 2001 342010 | 12/2001 |
| JP | 2005 206436 | 8/2005 |
| JP | 2005 272155 | 10/2005 |
| JP | 2006 62902 | 3/2006 |
| JP | 2006-104021 | * 4/2006 |

* cited by examiner

*Primary Examiner*—Edward J Cain
(74) *Attorney, Agent, or Firm*—Oblon, Spivak, McClelland, Maier & Neustadt, L.L.P.

(57) ABSTRACT

The present invention herein provides fine inorganic hollow powder having a high hollowness rate, which can be incorporated into, for instance, a low dielectric rubber or resin composition. The inorganic hollow powder has an average hollowness rate of higher than 70% by volume and an average particle size ranging from 3 to 20 μm and the powder preferably has an average hollowness rate ranging from 75 to 85% by volume, an average particle size ranging from 5 to 15 μm, a maximum particle size of not more than 25 μm, a specific surface area of not more than 10 $m^2/g$, an average sphericity degree of not less than 0.90 and a purity of not less than 99% by mass. The inorganic hollow powder can be prepared by a method comprising the steps of forming a flame using a burner provided with at least a triplet-tubular portion comprising, in order from the outermost side, a combustion-improving gas-supply pipe, a combustible gas-supply pipe and an inorganic raw powder-supply pipe assembled together; injecting, into the flame at a high discharge speed, inorganic raw powder having a specific particle size through the inorganic raw powder-supply pipe, while the powder is entrained with a carrier gas having a specific relative humidity, to thus subject the powder to a heat-treatment.

14 Claims, No Drawings

INORGANIC HOLLOW PARTICLE, PROCESS FOR PRODUCING THE SAME, AND COMPOSITION CONTAINING THE SAME

This application is a 371 of PCT/JP2007/058799, filed Apr. 24, 2007.

TECHNICAL FIELD

The present invention relates to inorganic hollow powder, a method for the preparation of the inorganic hollow powder and a composition obtained using the powder.

BACKGROUND ART

As inorganic hollow powder, there is spherical hollow glass powder. The spherical hollow glass powder has, for instance, a low specific gravity, low dielectric characteristics, high heat resistance and excellent thermal insulation properties, as compared with that of the inorganic non-hollow or solid powder. The applications of such inorganic powder, which make the most use of their light weight properties, include, for instance, molded resin parts such as those used in automobiles and portable electronic apparatuses; construction parts such as sealing compounds and exterior wall materials; and structural materials such as buoyancy materials for ships, while the applications thereof, which make the most use of the low dielectric characteristics of the powder include, for instance, multi-layer print-circuit boards, cladding materials for electric wires, and sealing agents for semiconductor devices. The recent requirements for the hollow glass powder are to further micronize the powder, to increase the rate of hollow particles (the hollowness rate of particles) and to realize or provide inorganic hollow powder made of inorganic materials other than the vitreous materials.

As a method for the preparation of hollow glass powder, there has conventionally been proposed one which comprises the step of firing silica gel powder on which a glass-forming agent and a foaming agent have previously been supported (see, Patent Document 1). This method makes it possible to form powder which has a particle density of about 0.3 g/cm³ and an average particle size of about 70 µm. However, the resulting powder contains the residual foaming agent and therefore, the purity of the powder is naturally limited. In addition, it was difficult to further micronize the resulting powder and to further increase the rate of hollow particles in the materials according to this method.

Patent Document 1: JP-B-4-37017.

DISCLOSURE OF THE INVENTION

Subject to be Attained by the Invention

It is an object of the present invention to provide inorganic hollow powder having a high purity, an enhanced degree of micronization and an improved rate of hollow particles (an improved rate of hollowness of the hollow powder) as well as a method for the preparation of the inorganic hollow powder. In addition, it is another object of the present invention to provide a rubber composition or a resin composition, whose weight and dielectric constant have further been reduced.

Means for Attaining the Subject

The present invention relates to inorganic hollow powder having an average rate of hollowness (average hollowness rate) of higher than 70% by volume and an average particle size ranging from 3 to 20 µm. Moreover, the present invention also relates to inorganic hollow powder having an average hollowness rate ranging from 75 to 85% by volume, an average particle size ranging from 5 to 15 µm, a maximum particle size of not more than 25 µm, a specific surface area of not more than 10 m²/g, an average degree of sphericity (average sphericity degree) of not less than 0.90 and a purity of not less than 99% by mass. It is preferred that the inorganic hollow powder should satisfy at least one of the following requirements: the inorganic hollow powder must be hollow amorphous silica powder; and the inorganic hollow powder must be treated with a surface-treating agent.

In addition, the present invention also relates to a method for the preparation of inorganic hollow powder, characterized in that the method comprises the steps of forming a flame using a burner provided with at least a triplet-tubular portion comprising, in order from the outermost side, a combustion-improving gas-supply pipe, a combustible gas-supply pipe and an inorganic raw powder-supply pipe assembled together; injecting, into the flame at a discharge speed of not less than 150 m/sec, inorganic raw powder having a specific surface area of not less than 500 m²/g and an average particle size of not more than 15 µm through the inorganic raw powder-supply pipe, while the powder is entrained with a carrier gas having a relative humidity (RH) ranging from 80 to 100%, to subject the powder to a heat-treatment and to thus form inorganic hollow powder; and thereafter classifying, if necessary, the resulting inorganic hollow powder. In this case, the inorganic raw powder is preferably silica powder whose specific surface area is not less than 700 m²/g.

In addition, the present invention likewise relates to a composition comprising the inorganic hollow powder of the present invention which is incorporated into either or both of rubber and a resin as components of the composition.

EFFECTS OF THE PRESENT INVENTION

The present invention can herein provide inorganic hollow powder having a high purity, a further enhanced degree of micronization and a further improved hollowness rate of the hollow materials. For instance, the present invention can provide inorganic hollow powder such as spherical hollow amorphous silica powder having a purity of 99.8% by mass, an average particle size ranging from 5 to 17 µm, an average hollowness rate ranging from 71 to 92% by volume and an average sphericity degree of not less than 0.90. As a result, a rubber composition or a resin composition (hereunder these compositions are referred to as "composition", collectively), which contains the inorganic hollow powder in an appropriate amount, may provide, for instance a varnish excellent in the moldability and having a viscosity of not higher than 700 mPa·s, in particular, not higher than 600 mPa·s. In addition, the resulting composition has a thermal expansion coefficient of not more than 30 ppm, in particular not more than 20 ppm, a flame retardancy of V-0, and a relative dielectric constant of not more than 2.8, in particular, not more than 2.5 (as determined at 25° C., 1 GHz).

BEST MODE FOR CARRYING OUT THE INVENTION

The inorganic hollow powder according to the present invention has an average rate of hollowness of higher than 70% by volume. Inorganic hollow powder may sufficiently show a weight-reduction effect, a thermal insulation-improving effect and a dielectric characteristics-reducing effect even when it has an average hollowness rate ranging from 50 to 70% by volume. When using the inorganic hollow powder in, for instance, multi-layer print-circuit boards, however, the content of the powder is controlled to a level of not more than 60% by volume because of an increase in the viscosity of the resulting varnish. Accordingly, to ensure further reduced dielectric characteristics under such conditions, the inorganic hollow powder to be incorporated desirably has a higher average hollowness rate and, for this reason, the average hollowness rate of the powder is herein limited to a level of higher than 70% by volume. Therefore, the upper limit of the average hollowness rate is not restricted to any specific one. If the average hollowness rate of the powder exceeds 90% by volume, however, the shell thickness of these particles is extremely small and the strength of the particles is accordingly reduced and the particles may be broken during the handling of these particles and/or the kneading of the same with rubber or a resin. Therefore, the average hollowness rate of the inorganic hollow powder preferably ranges from 75 to 85% by volume.

The term "average hollowness rate (an average rate of hollowness)" of the inorganic hollow powder used herein is defined to be the ratio of the practically determined particle density to the calculated or theoretical particle density. For instance, if the found density of hollow silica particles is 1.1 g/cm$^3$, the average hollowness rate thereof can be calculated to be 50% by volume, which is determined by dividing the found density (1.1 g/cm$^3$) by the theoretical density (2.2 g/cm$^3$) of the amorphous silica. In this respect, the density can be determined using an automatic true density meter for powdery and powder (such as a device available from SEISHIN Kigyo Co., Ltd. under the trade name of "Auto True Denser MAT-7000") according to the pycnometer technique.

The average particle size of the inorganic hollow powder according to the present invention ranges from 3 to 20 μm. In this respect, the use of inorganic hollow powder whose average particle size exceeds 20 μm, never adversely affects the reduction of the weight of any article, but it may result in the deterioration of the surface smoothness of the resulting article. Accordingly, in applications which intensively require such surface smoothness, the appearance thereof is impaired and the article may be damaged while the uneven portions on the surface thereof become a cause of such surface defect-formation. Moreover, the inorganic hollow powder cannot be used for the applications in which the thickness is restricted to any specific range. If the average particle size is less than 3 μm, the shell thickness is too small to enjoy the effect of the powder on the further reduction of the weight of an article and on the further reduction of the dielectric characteristics thereof and accordingly, the use of the inorganic hollow powder having such a small average particle size may result in the occurrence of the foregoing problem of particle-breakage.

The inorganic hollow powder according to the present invention preferably has an average hollowness rate ranging from 75 to 85% by volume, an average particle size ranging from 5 to 15 μm, a maximum particle size of not more than 25 μm, a specific surface area of not higher than 10 m$^2$/g, an average sphericity degree of not less than 0.90 and a purity of not less than 99.9% by mass. The average hollowness rate is controlled to the range of from 75 to 85% by volume and the average particle size is set at a level ranging from 5 to 15 μm for the same reasons discussed above in connection with the inorganic hollow powder having an average particle size ranging from 3 to 20 μm, and more specifically, these ranges are determined on the basis of the following standpoints: such as the reduction of the weight of a specific article, the reduction of the dielectric characteristics thereof and the elimination of the problem of causing any breakage of the powder. In addition, the reason why the maximum particle size of inorganic hollow powder is limited to a level of not more than 25 μm is that the loss of the foregoing surface smoothness is reduced.

The specific surface area of the inorganic hollow powder is preferably limited to a level of not higher than 10 m$^2$/g. This is because if the specific surface area is greater than the upper limit, the resulting inorganic hollow powder has an increased rate of the hollow and fine particles and accordingly, the moldability of the resulting composition containing the same may substantially be reduced when the powder is incorporated into the composition in a high content.

The average sphericity degree of the inorganic hollow powder is preferably limited to a level of not less than 0.90. This limitation would certainly permit the further improvement of the chargeability of the material to rubber and/or resins and the moldability of the resulting composition. The average sphericity degree thereof is particularly preferably not less than 0.92.

The average particle size and maximum particle size of the inorganic hollow powder are determined on the basis of the particle size distribution thereof as determined according to the laser diffraction-scattering technique. The particle size distribution is determined by dividing the particle sizes extending from 0.04 to 2000 μm into 116 portions at equal widths corresponding to log(μm)=0.04. An example of such measuring device includes "Model LS-230" available from Beckman-Coulter Co., Ltd. The measurement is carried out after blending water and a sample and then treating the resulting mixture using an ultrasonic homogenizer at an output of 200 W for one minute to thus give a uniform dispersion. At this stage, the PIDS (Polarization Intensity Differential Scattering) concentration is controlled to a level ranging from 45 to 55% by mass. In this respect, the refractive index of water is assumed to be 1.33 and that of each sample is specified to be the refractive index of the material thereof. For instance, it is assumed to be 1.50 in case of amorphous silica.

The average sphericity degree of the inorganic hollow powder is determined as follows: Images of particles obtained through the use of a stereoscopic microscope (such as "Model SMZ-10 Type" available from Nikon Corporation) are inputted in an image-analysis device (for instance, "MacView" available from Mountech Corporation) to thus determine the projected area (A) and the peripheral length or perimeter (PM) of each particle. In this connection, if the area of a true circle corresponding to the perimeter (PM) is assumed to be (B), the circularity of the corresponding particle is defined to be A/B. Accordingly, if assuming a true circle having a perimeter identical to that of the sample (PM), the relation: $B=\pi \times (PM/2\pi)^2$ can be derived, since $PM=2\pi r$ and $B=\pi r^2$. Consequently, the degree of sphericity of each individual particle can be defined to be as follows: Degree of Sphericity=A/B=A×4π/(PM)$^2$. Arbitrarily selected 200 particles are inspected for the sphericity degrees according to the foregoing method and the results are averaged and the resulting average value is defined to be the average sphericity degree of the sample.

The materials used for forming the inorganic hollow powder are not restricted to specific ones, but examples thereof suitably used herein are silica, alumina, zirconia, titania and magnesia, as well as compound oxides each comprising at least one of the materials listed above as a constituent thereof. Among them, amorphous silica is preferably used herein because of its excellent characteristic properties, for instance, a high strength, a low thermal expansion coefficient and low dielectric characteristics. The inorganic hollow powder preferably has a purity of not less than 98% by mass. In case of a compound oxide containing at least two components, the constituents of the compound oxide are not herein regarded as impurities.

The amount of impurities can be determined using, for instance, a fluorescent X-ray analysis device (XRF), an energy dispersion type fluorescent X-ray analysis device (EDX), an atomic absorption spectrometer (AAS) or a plasma emission spectrochemical analyzer (ICP). For instance, the purity of silica can be determined by dissolving it in a 20:1 (ratio by volume) hydrogen fluoride/hydrogen peroxide mixed solvent with heating, then diluting the resulting solution with pure water and then determining the purity thereof using, for instance, an atomic absorption spectrometer available from Shimadzu Corporation.

The rate of amorphousness can be determined by carrying out the X-ray diffraction analysis for the 2θ of CuKα-rays ranging from 26 to 27.5 degrees while using a powder X-ray diffraction analyzer (or instance, "Model Mini Flex"available from RIGAKU Co., Ltd.) and then determining the rate of amorphousness on the basis of the intensity ratio of specific diffraction peaks thus obtained. In case of silica, for instance, the crystalline silica shows a main peak at 26.7 degree in the X-ray diffraction pattern, while the amorphous silica is free of any peak. For this reason, if a sample includes both crystalline and amorphous silica, the height of the main peak appearing at an angle of 26.7 degree is proportional to the content of the crystalline silica. Accordingly, the content of the crystalline silica ([the intensity of the X-ray diffraction for the sample]/[the intensity of the X-ray diffraction for the reference sample of crystalline silica]) is calculated from the ratio of the X-ray intensity observed for the sample to that observed for the reference sample of crystalline silica and then the rate of amorphousness is calculated according to the following equation: Rate of Amorphousness (%)=(1−Content of Crystalline Silica)×100.

The inorganic hollow powder according to the present invention is preferably treated with a surface-treating agent such as a silane coupling agent. In general, the surface of the inorganic hollow powder is hydrophilic in nature and accordingly, the powder is insufficient in the dispersibility in a resin and/or a hydrophobic dispersant such as an organic solvent. For this reason, the treatment thereof with a surface-treating agent in advance would certainly permit the improvement of the dispersibility of the powder, while the surface treatment would likewise improve, for instance, the adhesion to rubber or resins, the peel strength and the moisture proof reliability of the powder. The rate of the surface-treating agent to be used preferably ranges from 0.05 to 2 parts by mass per 100 parts by mass of the inorganic hollow powder.

Specific examples of such surface-treating agents usable herein include silane coupling agents, Zr-chelates, titanate coupling agents, and aluminum-containing coupling agents. Examples of silane coupling agents are epoxy silanes such as γ-glycidoxypropyltrimethoxysilane and β-(3,4-epoxy-cyclohexyl)ethyltrimethoxysilane; aminosilanes such as aminopropyltriethoxysilane, ureidopropyltriethoxysilane and N-phenylaminopropyltrimethoxysilane; hydrophobic silane compounds such as phenyltrimethoxysilane, methyltrimethoxysilane, and octadecyltrimethoxy silane; and mercaptosilanes.

The inorganic hollow powder according to the present invention can be prepared by, for instance, the preparation method of the present invention. In this case, the inorganic hollow powder can be handled for increasing or reducing the average hollowness rate, average particle size, maximum particle size, specific surface area, average sphericity degree, and the rate of amorphousness of the powder according to the methods as will be detailed later. The purity of the inorganic hollow powder can be adjusted by controlling the purity of the inorganic raw powder used.

The preparation method of the present invention is characterized in that the specific surface area of the inorganic raw powder used, the discharge speed thereof and the moisture content of a carrier gas used for discharging the inorganic raw powder are limited to specific ranges, respectively. In this respect, the intended inorganic hollow powder whose purity is not less than 99% by mass, average hollowness rate is higher than 70% by volume and average particle size ranges from 3 to 20 µm cannot be produced even if any one of the foregoing three characteristic properties is beyond the range specified above. More specifically, if the specific surface area of the inorganic raw powder used is less than 500 $m^2/g$ or the average particle size thereof exceeds 15 µm, it would be difficult to prepare inorganic hollow powder having an average hollowness rate of higher than 70% by volume. The specific surface area of the inorganic raw powder used is preferably not less than 600 $m^2/g$ and, in particular, not less than 700 $m^2/g$, and the maximum specific surface area thereof is suitably set at a level of 1200 $m^2/g$. Particularly preferably, the inorganic raw powder has an average particle size ranging from 2 to 8 µm. Moreover, the maximum particle size thereof is preferably not more than 25 µm.

The inorganic raw powder is entrained by a carrier gas and injected into a flame at a discharge speed of not less than 150 m/sec. In this respect, if the discharge speed is less than 150 m/sec, the inorganic raw powder would be in a superheated state, solid particles are partially formed, this in turn results in the reduction of the hollowness rate and the occurrence of coagulation and various drawbacks arise such that the particle size of the resulting inorganic powder becomes too large. The discharge speed of the inorganic raw powder particularly preferably ranges from 200 to 300 m/sec.

The carrier gas usable herein includes, for instance, air, oxygen, and/or argon gases. The moisture content of the carrier gas is quite important in the present invention and accordingly, the present invention employs a carrier gas having a relative humidity (RH) ranging from 80 to 100%. In particular, it is preferred to use a carrier gas having an RH ranging from 90 to 100%. When using such a carrier gas, the inorganic raw powder contains moisture, water vapor is accordingly generated when treating the powder with a flame, this in turn improves the effect of expanding the raw powder and accordingly, the hollowness rate of the resulting inorganic hollow powder can further be increased. On the other hand, if the RH is less than 80%, moisture never penetrates even into the interior of the inorganic raw powder and therefore, there cannot be accomplished any sufficient effect of expanding the raw powder at all. The moisture content of the carrier gas can be controlled by adjusting the bubbling time or the residence time in a bubbling device filled with pure water, when the carrier gas is moistened by passing though the bubbling device. Alternatively, the moisture content of the carrier gas can likewise be controlled by appropriately changing the mixing ratio of the carrier gas bubbled through water to the carrier gas free of any bubbling treatment.

The materials used for forming the inorganic hollow powder may be, for instance, silica, alumina, zirconia, titania, magnesia and calcia, as well as compound oxides each comprising at least one of these materials as a constituent thereof. Among them, silica gel powder having a specific surface area of not less than 700 $m^2/g$ is preferably used for the preparation of hollow amorphous silica powder. Such hollow amorphous silica powder is excellent, in particular, in the electrical characteristics and the chemical stability and the composition obtained using the silica powder is quite excellent in its moldability.

With the use of a burner provided with at least a triplet-tubular portion which comprises, in order from the outermost side, a combustion-improving gas-supply pipe, a combustible gas-supply pipe and an inorganic raw powder-supply pipe assembled together, the inorganic raw powder is injected into the flame of the burner through the inorganic raw powder-supply pipe. In this respect, the term "burner provided with at least a triplet-tubular portion" herein used means a burner which may further be provided with one or at least two members selected from the group consisting of a combustible gas-supply pipe, a combustion-improving gas-supply pipe and an inorganic raw powder-supply pipe, arranged in the proximity to the triplet-tubular portion. The flame can be formed by injecting, into a furnace, the corresponding gases through the combustible gas-supply pipe and/or the combustion-improving gas-supply pipe. Examples of the combustible gases usable herein include hydrocarbon gases such as methane, ethane, acetylene, propane, butane and propylene gases, for instance, LPG gas; and hydrogen gas, while examples of combustion-improving gases are air and oxygen gas.

The furnace for forming the flame (the furnace in which the raw powder is heat-treated) may be any type one such as vertical one and horizontal one, but preferably used herein is a vertical type one which comprises the foregoing burner arranged at the top thereof and which is connected to a collector system at the bottom thereof, in view of preventive effect of the inorganic hollow powder from adhering to the inside of the furnace, flame stability and stable operability. The collector system is provided with a dust collector and the inorganic hollow powder thus formed is drawn out, transported and collected by the action of a blower disposed on the exhaust side, and optionally classified. Examples of such dust collectors are cyclone, an electrostatic precipitator, and a bag filter. In respect of the structure of the vertical furnace, other than the burner structure, there have been known various kinds of structures and either of them can be used in the present invention.

The average sphericity degree of the inorganic hollow powder can mainly be adjusted and/or controlled by adjusting the temperature in the furnace through the control of the flow rate of the combustible gas. In addition, the average particle size, the maximum particle size, and the specific surface area can principally be adjusted and/or controlled by the control of the particle size of the inorganic raw powder used and the discharge speed of the raw powder. The average hollowness rate can be adjusted and/or controlled by the control of the specific surface area of the raw powder, the discharge speed of the raw powder and in particular, the control of the relative humidity of the carrier gas. More specifically, if the flow rate of the combustible gas is increased, the temperature in the furnace increases, the raw powder is thus sufficiently heated and accordingly, the resulting inorganic hollow powder has a high average sphericity degree. In addition, if the relative humidity (RH) of the carrier gas is controlled to a level of not less than 80%, the effect of expanding the inorganic raw powder is improved and accordingly, inorganic hollow powder having an average hollowness rate can be obtained, but when the flow rate of the combustible gas is extremely increased or the speed of discharging the inorganic raw powder into the flame is reduced to an extremely low level, for instance, the powder formed is in a superheated condition, a part of the resulting inorganic hollow powder is composed of solid particles or the resulting inorganic hollow powder has a reduced hollowness rate, and the resulting inorganic hollow powder has an extremely large particle size because of the coagulation thereof.

The composition of the present invention is prepared by incorporating the inorganic hollow powder into at least one of rubber and a resin. The content of the inorganic hollow powder in the composition is not restricted to any specific one and it is, for instance, in the range of from 1 to 97% by mass.

Examples of rubber materials are natural rubber, polybutadiene rubber (BR), styrene-butadiene copolymer rubber (SBR), polyisoprene rubber (IR), nitrile-butadiene copolymer rubber (NBR), and butyl rubber (IIR).

Examples of the foregoing resins are epoxy resins, silicone resins, phenolic resins, melamine resins, urea resins, unsaturated polyesters, fluorine plastics, BT resins, polyimides, polyamide-imide resins, polyamides such as polyether-imides, polyesters such as polybutylene terephthalate and polyethylene terephthalate, polyphenylene sulfide, completely aromatic polyesters, polysulfones, liquid crystalline polymers, polyether sulfones, polycarbonates, maleimide-modified resins, ABS resins, AAS (acrylonitrile-acryl rubber/styrene) resins, and AES (acrylonitrile/ethylene/propylene/diene rubber/styrene) resins.

Among them, epoxy resins each containing at least two epoxy groups in the molecule are preferably used as materials for forming multi-layer print-circuit boards and for sealing semiconductor devices. Specific examples thereof include phenol-novolak type epoxy resins, o-cresol-novolak type epoxy resins, products obtained through epoxydation of novolak resins of phenols and aldehydes, glycidyl ethers such as bisphenol A, bisphenol F and bisphenol S, glycidyl ester acid-epoxy resins obtained by the reactions of phthalic acid and dimer acids with epichlorohydrin, linear aliphatic epoxy resins, alicyclic epoxy resins, heterocyclic epoxy resins, alkyl-modified polyfunctional epoxy resins, β-naphthol novolak type epoxy resins, 1,6-dihydroxy-naphthalene type epoxy resins, 2,7-dihydroxy-naphthalene type epoxy resins, bis-hydroxy biphenyl type epoxy resins, and epoxy resins in which halogen atoms such as bromine atoms are introduced for imparting flame retardant properties to the resins. Suitably used herein include, for instance, o-cresol-novolak type epoxy resins, bis-hydroxy biphenyl type epoxy resins and naphthalene skeleton-containing epoxy resins, from the viewpoint of, in particular, resistance to moisture and resistance to solder-reflowing.

The epoxy resin-curing agent used herein is, for instance, at least one member selected from the group consisting of novolak type resins, poly (p-hydroxy styrene) resins, phenols, acid anhydrides, and aromatic amines. Examples of such novolak type resins used herein are those prepared by reacting at least one member selected from the group consisting of phenol, cresol, xylenol, resorcinol, chlorophenol, t-butyl phenol, nonylphenol, isopropyl phenol and octyl phenol with, for instance, at least one member selected from the group consisting of formaldehyde, paraformaldehyde, and p-xylene, in the presence of an oxidation catalyst. Examples of phenols are bisphenol compounds such as bisphenol A and bisphenol S, and tri-functional phenols such as pyrogallol and fluoroglucinol. Examples of acid anhydrides are maleic anhydride, phthalic anhydride, and pyromellitic anhydride; examples of the aromatic amines are m-phenylene-diamine, diaminodiphenyl methane, and diaminodiphenyl sulfone.

When the composition of the present invention is an epoxy resin composition, a curing-accelerator may be incorporated into the resin composition for the acceleration of the reaction between the epoxy resin with the epoxy resin-curing agent.

Such a curing-accelerator usable herein may be, for instance, at least one member selected from the group consisting of 1,8-diazabicyclo(5,4,0)-undecene-7, triphenylphosphine, benzyl dimethyl-amine, and 2-methylimidazole.

The composition of the present invention further comprises, if necessary, additional additives such as a stress-reducing agent, a flame retardant agent, an auxiliary flame retardant agent, a coloring agent and/or a releasing agent. Such stress-reducing agent usable herein may be, for instance, silicone rubber, polysulfide rubber, acrylic rubber, butadiene type rubber, styrenic block copolymers and rubbery substances such as saturated elastomers, and modified epoxy resins and modified phenolic resins, which are modified with, for instance, amino-silicones, epoxy-silicones, and/or alkoxy-silicones. The auxiliary flame retardant agent may be, for instance, $Sb_2O_3$, $Sb_2O_4$, and $Sb_2O_5$. Examples of the flame retardant agents are halogenated epoxy resins and phosphorus atom-containing compounds; and the coloring agent usable herein may be, for instance, carbon black, iron oxides, dyes and pigments. Examples of the foregoing releasing agents usable herein are natural waxes, synthetic waxes, metal salts of linear fatty acids, acid amides, esters, and waxes such as paraffins.

In the applications which require high moisture proof reliability and a high stability when allowing the composition to stand at a high temperature, it is effective to incorporate an ion-trapping agent into the same. Examples of such ion-trapping agents are those available from Kyowa Chemical Co., Ltd. under the trade names of "DHF-4A", "KW-2000" and "KW-2100"; and those available from Toagosei Chemical Industry Co., Ltd. under the trade name of "IXE-600."

The composition of the present invention can be prepared by, for instance, blending the predetermined amounts of the foregoing ingredients in, for instance, a blender or a Henschel mixer; kneading the resulting blend using, for instance, heated rolls, a kneader, or a single-screw or twin-screw extruder; cooling the kneaded product; and then pulverizing the kneaded and cooled product. When applying the composition to multi-layer print-circuit boards or paints and varnishes, the foregoing ingredients are mixed with an organic solvent to thus form a varnish. To this end, there can be used a mixing device such as a thunder mill, a beads mill, a triple roll mill, and a stirring mixer. After the preparation of such a varnish, it is preferred to remove any air bubbles present in the varnish according to the vacuum deaeration. Moreover, it would be effective to add, to the composition, an anti-foaming agent such as a silicone type, acryl type and/or a fluorine atom-containing one, for the purpose of imparting an anti-foaming or foam-breaking function to the composition.

EXAMPLES

The device used in the following Examples is a vertical furnace comprising three burners each provided with a triplet-tubular structure nozzle, which comprises, in order from the outermost side, a combustion-improving gas-supply pipe, a combustible gas-supply pipe and an inorganic raw powder-supply pipe assembled together, wherein the burners are arranged on the top portion of the vertical furnace. On the other hand, the bottom of the vertical furnace is connected to a collection system (a cyclone and a bag filter), the inorganic hollow powder formed in the furnace is drawn out of the furnace together with the combustion exhaust gas by the action of a blower and the powder is thus collected by the cyclone and the bag filter.

Examples 1 to 6 and Comparative Examples 1 to 5

A flame was formed by supplying, per one burner, LPG gas through the combustible gas-supply pipe at a flow rate ranging from 3 to 5 $Nm^3/Hr$ and oxygen gas through the combustion-improving gas-supply pipe at a flow rate ranging from 3 to 5 $Nm^3/Hr$, while about 2.5 kg/Hr of inorganic raw powder (silica gel powder) was entrained by a carrier gas (an oxygen-enriched air; flow rate: 10 to 40 $Nm^3/Hr$) whose relative humidity had been controlled to a level ranging from 50 to 100% by making the carrier gas pass through a bubbling device packed with pure water and the inorganic raw powder entrained by the carrier gas were then injected into the center of the flame through the inorganic raw powder-supply pipe of the burner. At this stage, the discharge speed of the inorganic raw powder was found to be 100 to 300 m/sec. As a result, there were collected, through the cyclone, inorganic hollow powdery products (spherical hollow silica powder) having different characteristic properties depending on the difference in the amount of the supplied LPG, that of the supplied oxygen gas, and the discharge speed of the inorganic raw powder. The resulting inorganic hollow powdery products were inspected for the average hollowness rates, the average particle sizes, the maximum particle sizes, the specific surface areas, the average sphericity degrees, and the purities according to the methods detailed above. The results thus obtained are summarized in the following Table 1. In this connection, when surface-treating the resulting inorganic hollow powdery product with a silane coupling agent, vinyl silane was used in an amount of 0.5 parts by mass per 100 parts by mass of the inorganic hollow powdery product. In addition, these components were mixed together using a Henschel mixer and the mixing was continued for 10 minutes.

To evaluate the characteristic properties of the resulting inorganic hollow powdery products, there were dissolved, in 200 parts by mass of methyl ethyl ketone, 100 parts by mass of brominated bisphenol A type liquid epoxy resin, 4 parts by mass of dicyandiamide, and 0.2 parts by mass of 2-ethyl-4-methyl imidazole, followed by the addition of one part by mass of 3-glycidoxypropyl trimethoxy silane and 100 parts by volume (per 100 parts by volume of the foregoing epoxy resin) of each inorganic hollow powdery product to the resulting solution and stirring of the resulting mixture for 10 minutes in a high speed mixer to thus form a varnish.

The viscosity of each resulting varnish was determined and then a glass cloth was impregnated with the varnish, followed by heating the glass cloth in an electric oven maintained at a temperature of 150° C. for 5 hours and cutting the cloth into pieces to thus form prepreg. Twelve pieces of each prepreg were put in layers, each assembly was press-molded with heating at a pressure of 5.0 MPa and a temperature of 180° C. for 200 minutes to thus give a laminated sheet and the latter was inspected for the thermal expansion coefficient, the flame retardant properties and the relative dielectric constant. The results thus obtained are summarized in the following Table 1.
(1) Viscosity of Varnish: This was determined using an E-type viscometer available from Toquimeck Company, provided with a cone rotor of 3 deg. R14, under the following conditions: temperature: 30° C.; and rotational number of rotor: 2.5 rpm.
(2) Thermal Expansion Coefficient of Laminated Sheet: A test piece having a size of 5 mm (diameter)×10 mm (height) was cut out from each laminated sheet and the thermal expansion coefficient of the test piece was determined using a thermal mechanical analyzer (TMA) available from Shimadzu Corporation, according to the standard specified in JIS K7197.

(3) Flame Retardant Properties of Laminated Sheet: A test piece having a size of 12.7 mm×127 mm×1 mm was cut out from each laminated sheet and the flame retardant properties of each test piece was determined according to the standard specified in UL-94.

(4) Relative Dielectric Constant of Laminated Sheet: A test piece having a size of 100 mm (diameter)×2 mm (thickness) was cut out from each laminated sheet and the relative dielectric constant of each test piece was determined using a dielectric constant-determining device available from Hewlett Packard Corporation according to the standard specified in JIS K6911.

TABLE 1

| Ex. No. | 1 | 2 | 3 | 4 | 5 | 6 |
| --- | --- | --- | --- | --- | --- | --- |
| Inorganic raw powder | | | | | | |
| Specific surface area ($m^2$/g) | 725 | 743 | 723 | 762 | 529 | 762 |
| Average particle size (μm) | 3.7 | 7.2 | 14 | 7.5 | 8.2 | 9.7 |
| Conc. of oxide other than $SiO_2$ (% by mass) | 0.2 | 0.2 | 0.2 | 0.3 | 0.2 | 0.3 |
| Discharge speed of inorganic raw powder (m/sec) | 180 | 250 | 300 | 280 | 280 | 280 |
| Relative humidity (RH) of carrier gas (%) | 90 | 98 | 95 | 88 | 82 | 88 |
| Inorganic hollow or glass powder | | | | | | |
| Average hollowness rate (% by volume) | 77 | 83 | 92 | 76 | 73 | 76 |
| Average particle size (μm) | 4.1 | 7.5 | 17 | 8.2 | 8.5 | 11 |
| Maximum particle size (μm) | 11 | 13 | 26 | 14 | 15 | 14 |
| Specific surface area ($m^2$/g) | 8.2 | 4.1 | 3.1 | 3.5 | 11 | 3.5 |
| Average sphericity degree (-) | 0.91 | 0.92 | 0.92 | 0.90 | 0.90 | 0.90 |
| Surface treatment | Yes | Yes | Yes | Yes | Yes | No |
| Conc. of oxide other than $SiO_2$ (% by mass) | 0.2 | 0.2 | 0.2 | 0.2 | 0.2 | 0.2 |
| Laminated sheet | | | | | | |
| Viscosity of Varnish (mPa·s) | 640 | 530 | 680 | 510 | 580 | 860 |
| Thermal expansion coefficient (ppm) | 16 | 15 | 20 | 16 | 17 | 16 |
| Flame retardance (UL-94, Vertical method) | V-0 | V-0 | V-0 | V-0 | V-0 | V-0 |
| Relative dielectric constant (-), 25° C., 1 GHz | 2.8 | 2.3 | 2.7 | 2.5 | 2.7 | 2.6 |

| Comp. Ex. No. | 1 | 2 | 3 | 4 | 5 |
| --- | --- | --- | --- | --- | --- |
| Inorganic raw powder | | | | | |
| Specific surface area ($m^2$/g) | 758 | 468 | 683 | 760 | 760 |
| Average particle size (μm) | 6.0 | 8.1 | 2.4 | 19 | 19 |
| Conc. of oxide other than $SiO_2$ (% by mass) | 0.3 | 0.3 | 0.2 | 0.2 | 0.2 |
| Discharge speed of inorganic raw powder (m/sec) | 250 | 100 | 280 | 280 | 280 |
| Relative humidity (RH) of carrier gas (%) | 50 | 90 | 90 | 95 | 95 |
| Inorganic hollow or glass powder | | | | | |
| Average hollowness rate (% by volume) | 61 | 65 | 75 | 67 | 67 |
| Average particle size (μm) | 6.5 | 8.2 | 2.3 | 22 | 22 |
| Maximum particle size (μm) | 10 | 13 | 10 | 32 | 32 |
| Specific surface area ($m^2$/g) | 9.6 | 22 | 5.8 | 12 | 12 |
| Average sphericity degree (-) | 0.91 | 0.90 | 0.91 | 0.89 | 0.89 |
| Surface treatment | Yes | Yes | Yes | Yes | No |
| Conc. of oxide other than $SiO_2$ (% by mass) | 0.2 | 0.3 | 0.2 | 0.2 | 0.2 |
| Laminated sheet | | | | | |
| Viscosity of Varnish (mPa·s) | 600 | 700 | 830 | 780 | 1090 |
| Thermal expansion coefficient (ppm) | 18 | 31 | 19 | 28 | 29 |
| Flame retardance (UL-94, Vertical method) | V-0 | V-0 | V-0 | V-0 | V-0 |
| Relative dielectric constant (-), 25° C., 1 GHz | 3.4 | 3.2 | 2.8 | 3.1 | 3.2 |

As will be clear from the comparison between the results obtained in Examples and Comparative Examples, the Examples of the present invention permitted the preparation of laminated sheets each having a varnish viscosity of not more than 700 mPa·s, in particular, not more than 600 mPa·s, which resulted in the excellent moldability, a thermal expansion coefficient of not more than 30 ppm, in particular not more than 20 ppm, a flame retardancy of V-0, a relative dielectric constant of not more than 2.8, in particular not more than 2.5, as well as the preparation of inorganic hollow powder used in the laminated sheet, which had a purity of not less than 99%, an average hollowness rate of higher than 70% by volume and an average particle size ranging from 3 to 20 μm.

INDUSTRIAL APPLICABILITY

The inorganic hollow powder according to the present invention can be used as a resin-molding part such as a molding compound for forming, for instance, parts of automobiles, portable electronic machinery and tools and household appliance, as well as fillers for use in putty, sealing materials, buoyancy materials for ships, artificial timbers, reinforced cement exterior wall materials, and light-weight exterior wall materials. In addition, the composition of the present invention can be used in the prepreg such as that for printed circuit boards, which can be prepared by, for instance, impregnating a glass woven fabric, a glass nonwoven fabric or another organic substrate with the composition; electronic parts obtained by molding, with heating, one or a plurality of prepreg sheets together with, for instance, a copper foil; and in the preparation of cladding materials for electric wires, sealing materials for semiconductor devices and varnishes.

What is claimed is:

1. An inorganic hollow powder having an average hollowness rate of higher than 70% by volume and an average particle size ranging from 3 to 20 μm, wherein the inorganic hollow powder is treated with a surface-treating agent.

2. An inorganic hollow powder having an average hollowness rate ranging from 75 to 85% by volume, an average particle size ranging from 5 to 15 μm, a maximum particle size of not more than 25 μm, a specific surface area of not more than 10 m2/g, an average sphericity degree of not less than 0.90 and a purity of not less than 99% by mass.

3. The inorganic hollow powder of claim 1, wherein the inorganic hollow powder is hollow amorphous silica powder.

4. The inorganic hollow powder of claim 2, wherein the inorganic hollow powder is hollow amorphous silica powder.

5. The inorganic hollow powder of claim 1, wherein the inorganic hollow powder is treated with a surface-treating agent in an amount of 0.05 to 2 parts by mass per 100 parts by mass of the inorganic hollow powder.

6. The inorganic hollow powder of claim 2, wherein the inorganic hollow powder is treated with a surface-treating agent.

7. A method for the preparation of an inorganic hollow powder, comprising:
forming a flame using a burner provided with at least a triplet-tubular portion comprising, in order from the outermost side, a combustion-improving gas-supply pipe, a combustible gas-supply pipe and an inorganic raw powder-supply pipe assembled together;
injecting, into the flame at a discharge speed of not less than 150 m/sec, inorganic raw powder having a specific surface area of not less than 500 $m^2/g$ and an average particle size of not more than 15 μm through the inorganic raw powder-supply pipe, while the powder is entrained within a carrier gas having a relative humidity, RH, ranging from 80 to 100%, to heat-treat the powder and to thus form inorganic hollow powder; and
classifying, if necessary, the resulting inorganic hollow powder.

8. The method of claim 7, wherein the inorganic raw powder is silica powder having a specific surface area of not less than 700 $m^2/g$.

9. A composition comprising the inorganic hollow powder of claim 1, in which the powder is incorporated into a material selected from the group consisting of rubber and resin.

10. A composition comprising the inorganic hollow powder of claim 9, in which the powder is incorporated into a material selected from the group consisting of rubber and resin.

11. The inorganic hollow powder of claim 1, wherein the surface-treating agent is selected from the group consisting of silane coupling agents, Zr-chelates, titanate coupling agents, and aluminum-containing coupling agents.

12. The inorganic hollow powder of claim 11, wherein the surface-treating agent is selected from the group consisting of γ-glycidoxypropyltrimethoxysilane, β-(3,4-epoxy-cyclohexyl)ethyltrimethoxysilane, aminopropyltriethoxysilane, ureidopropyltriethoxysilane, N-phenylaminopropyltrimethoxysilane, phenyltrimethoxysilane, methyltrimethoxysilane, and octadecyltrimethoxy silane.

13. The inorganic hollow powder of claim 5, wherein the surface-treating agent is selected from the group consisting of silane coupling agents, Zr-chelates, titanate coupling agents, and aluminum-containing coupling agents.

14. The inorganic hollow powder of claim 13, wherein the surface-treating agent is selected from the group consisting of γ-glycidoxypropyltrimethoxysilane, β-(3,4-epoxy-cyclohexy)ethyltrimethoxysilane, aminopropyltriethoxysilane, ureidopropyltriethoxysilane, N-phenylaminopropyltrimethoxysilane, phenyltrimethoxysilane, methyltrimethoxysilane, and octadecyltrimethoxy silane.

* * * * *